United States Patent [19]

Furushima et al.

[11] Patent Number: 4,650,984
[45] Date of Patent: Mar. 17, 1987

[54] PHOTOSENSOR ARRAY FOR TREATING IMAGE INFORMATION

[75] Inventors: Teruhiko Furushima, Yokohama; Yuichi Masaki, Kawasaki; Masaki Fukaya, Yokohama; Nobuyuki Sekimura, Kawasaki, all of Japan

[73] Assignee: Canon Kabushiki Kaisha, Tokyo, Japan

[21] Appl. No.: 688,356

[22] Filed: Jan. 2, 1985

[30] Foreign Application Priority Data

Jan. 12, 1984 [JP] Japan .................................. 59-2579
Feb. 10, 1984 [JP] Japan .................................. 59-21931

[51] Int. Cl.⁴ ............................................. H01J 40/14
[52] U.S. Cl. .................................. 250/211 R; 250/578
[58] Field of Search ............... 250/200, 206, 208, 209, 250/211 R, 211 K, 216, 578; 356/222; 365/112; 350/163, 164, 276 R, 276 SL

[56] References Cited

U.S. PATENT DOCUMENTS 4,394,749 7/1983 Tsukada et al. ................ 365/112 X
4,401,887 8/1983 Finley et al. ......................... 250/216
4,419,696 12/1983 Hamano et al. ............ 250/211 R X Primary Examiner—Eugene R. LaRoche
Assistant Examiner—David Mis
Attorney, Agent, or Firm—Fitzpatrick, Cella, Harper & Scinto

[57] ABSTRACT

A photosensor array comprises a substrate, a photoconductive layer and electrode layers between which the photoconductive layer is provided, wherein an opaque electroconductive layer is provided at a side opposite to a side to which a signal light is projected, and an insulating layer intervenes between the opaque electroconductive layer and the combination of the electrodes and the photoconductive layer. In a photosensor array of a matrix driving type using a multilayer wiring, an insulating layer between electrodes at the multilayer wiring portion and a protective insulating layer at a photoelectric transducer portion are continuously formed by using the same material.

8 Claims, 11 Drawing Figures

SIGNAL LIGHT

PHOTOSENSOR ARRAY FOR TREATING IMAGE INFORMATION

BACKGROUND OF THE INVENTION

1. Field of the Invention

This invention relates to a photosensor array which can be used for deriving a light signal in photoelectric transducers for treating image informations such as facsimile transmitter and receiver, letter reading apparatuses and the like.

2. Description of the Prior Art

Heretofore, as photoelectric transducing means constituting image reading portions such as digital copiers, facsimile and the like, there have been generally used one dimensional photosensor arrays of a silicon photodiode type using crystalline silicon. However, since the size of silicon single crytal which can be produced is limited, the size of the photosensor can not be enlarged as much as might be desired. Further, from the standpoint of the processing accuracy, the length of the photosensor is limited and the manufacturing yield of the photosensor is disadvantageously low.

Therefore, when the width of an original to be read is large, for example, 210 mm, a lens system is used to form the reduced size image on a photosensor for reading. When such an optical system for reduction is used, it is difficult to miniaturize a light receiving portion, and moreover, it is inevitable to make the area of each picture element of the photosensor smaller to keep a high resolution. As a result, in order to obtain sufficient signal currents, a large quantity of light is required, and therefore, the photosensor array as mentioned above is now used for a low speed type apparatus where the reading time is long, or a reading apparatus where a high resolution is not required. From the standpoint of the driving of photosensors, in the above-mentioned diode type photosensor the photocurrent is so small that matrix-driving is difficult and there should be used a direct driving system where the sensor and integrated circuitry correspond to each other in such a manner as "one to one". Consequently, many driving integrated circuitry are inevitably required and, thereby, the photosensor array becomes expensive.

On the contrary, there have been recently proposed photoconductive type photosensors using amorphous silicon (a-Si). The photosensor is fabricated by forming an a-Si thin layer on a substrate according to vacuum deposition methods so that photosensor arrays of a large area or a large length can be easily produced. Thus, by means of photosensor arrays utilizing a-Si, the reading can be made at the same size even if the width of the original is large. As a result, the apparatus can be easily made smaller. In addition, in the case of photosensors of this type there can be obtained a photocurrent of about 100 times that in the case of photosensors of diode type so that matrix driving is possible resulting in a decrease in the number of integrated circuits used and in a low cost for photosensor arrays.

An example of conventional photoconductive type photosensor arrays is shown in FIGS. 1A, 1B and 1C. FIG. 1A is a schematic partial plan view, FIG. 1B is a schematic cross sectional view taken along a line X—X', FIG. 1C is a schematic cross sectional view taken along a line Y—Y'. In FIG. 1, 11 is a substrate, 12 a photoconductive layer as a photoelectric converting portion, 13 a common electrode layer, and 14 an individual electrode layer. In a photosensor array of such a structure as mentioned above, in the case that reading is effected by irradiating with image information signal light from the side of substrate 11, if light other than the image information signal light comes to photoconductive layer 12, it causes noise which interferes with the correct reading of the image formation, which noise appears in the electric signal output by the photosensor array. Further, in the case of the prior art photosensor array as mentioned above, photoconductive layer 12, common electrode layer 13 and individual electrode layer 14 are not electrically shielded, and therefore, external electric noise is liable to come in. As a result, the reading electric signal does not exactly correspond to the image information so that the resolution of reading is disadvantageously lowered.

For matrix driving of a photoconductive type photosensor array, there may be employed a multilayer wiring system where connecting electrodes of a driving circuit are arranged above electrodes of a photosensor with an insulating layer intervening therebetween and with the connecting electrodes and the photosensor electrodes electrically coupled at the portions at which the electrodes cross each other.

On the other hand, it is desirable to attach an insulating layer onto a photoconductive layer of a photoelectric converting portion of a photosensor.

Methods for fabricating such prior art photoconductive type photosensor array of matrix driving type are relatively complicated.

SUMMARY OF THE INVENTION

An object of the present invention is to provide a photosensor array free from the abovementioned drawbacks.

Another object of the present invention is to provide a photosensor array of a photoconductive type in which noise generated in the reading of light and in the resultant electric signals is low and the resolution is high.

A further object of the present invention is to provide a photoconductive type photosensor array of matrix driving type whose fabrication steps are simplified.

According to one aspect of the present invention, there is provided a photosensor array comprising a substrate, a photoconductive layer and first and second electrode layers between which the photoconductive layer is provided, wherein an opaque electroconductive layer is provided at a side opposite to a side on which a signal light is projected, and an insulating layer intervenes between the opaque electroconductive layer and the combination of the electrodes and the photoconductive layer.

According to another aspect of the present invention, there is provided a photosensor array matrix-driven by a multilayer wiring, wherein an insulating layer between electrodes at the multilayer wiring portion and a protective insulating layer at a photoelectric transducer portion are continuously formed by using the same material.

DESCRIPTION OF THE PREFERRED EMBODIMENTS

Figure 1A:
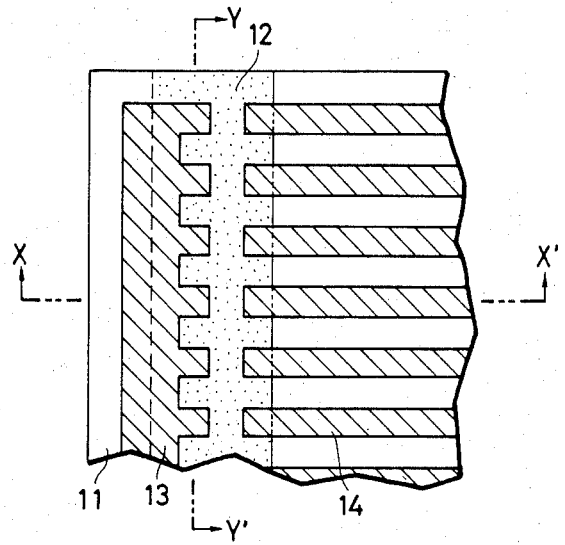
FIG. 1A is a partial plan view of a prior art photosensor.
Figure 1B:
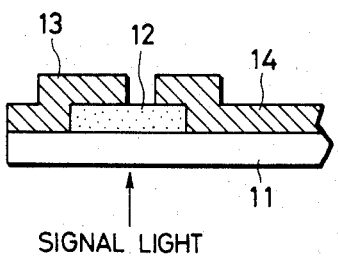
FIG. 1B and FIG. 1C are the X—X' cross sectional view and the Y—Y' cross sectional view of FIG. 1A, respectively.
Figure 1C:
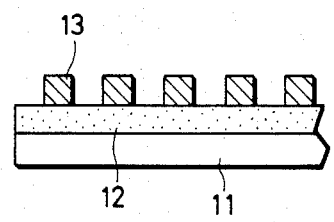

The present invention will be explained below referring to the drawings.

Figure 2A:
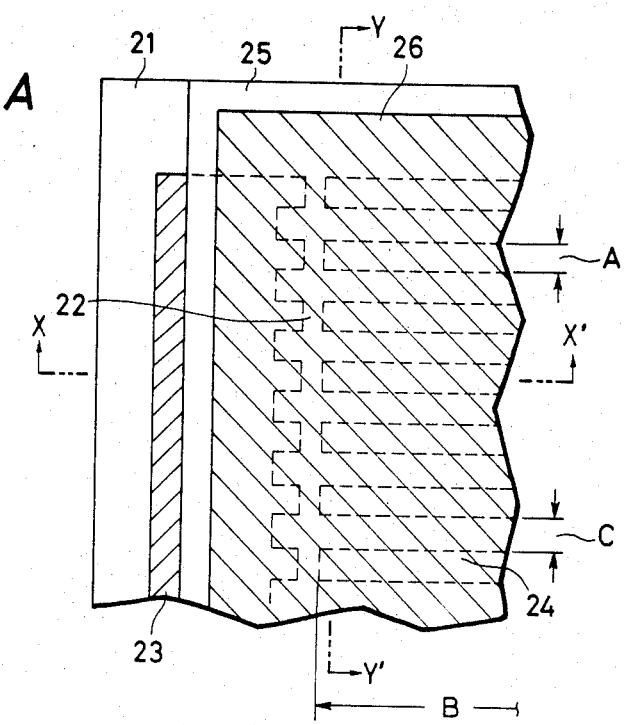
FIG. 2A is a partial plan view of a photosensor array according to the present invention.
Figure 2B:
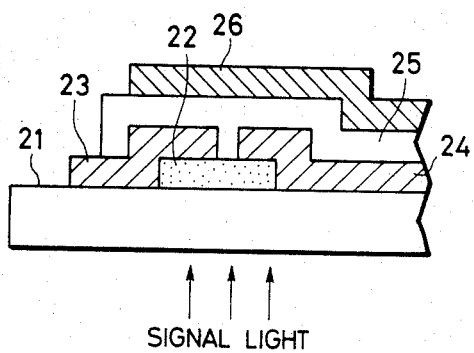
FIG. 2B and FIG. 2C are the X—X' cross sectional view and the Y—Y' cross sectional view of FIG. 2A, respectively.
Figure 2C:
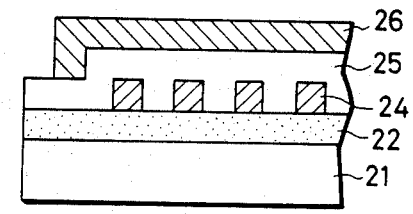

FIGS. 2A, 2B and 2C refer to a first embodiment of the photosensor according to the present invention. FIG. 2A is a schematic partial plan view, FIG. 2B is the X—X' schematic cross section of FIG. 2A and FIG. 2C is the Y—Y' schematic cross section of FIG. 2A. In the Figures, a substrate 21 is composed of a transparent member such as glass or the like. A photoconductive layer 22 is a thin or thick film composed of, for example, a-Si, cadmium sulfide (CdS), cadmium-tellurium (Cd-Te), amorphous selenium (a-Se) or amorphous selenium-tellurium (a-Se-Te). A common electrode layer 23 and an individual electrode layer 24 are composed of electroconductive films such as aluminum (Al) film and the like. An insulating layer 25 is composed of, for example, an organic film such as a polyimide resin or the like. An opaque electroconductive layer 26 is constituted of a light-shielding electroconductive film such as chromium (Cr), titanium (Ti), aluminum (Al), tantalum (Ta), carbon paste film or the like.

The above-mentioned photosensor array can be fabricated, for example, as shown below. First an a-Si film is formed in the thickness of 1μ on a glass substrate 21 by a glow discharge decomposition method. Thus a photoconductive layer 22 composed of a-Si containing hydrogen or halogen is formed. An aluminum film is formed over the whole surface on the photoconductive layer 22 in the thickness of 0.3μ according to a vacuum vapor deposition method, and then a pattern processing is effected by using a positive type Az-1370 photoresist and an etching liquid of a phosphoric acid type to produce a common electrode layer 23 and an individual electrode layer 24. To the resulting surface is applied a polyimide resin five times by screen printing followed by curing the resin at 350° C. to produce an insulating layer 25 of 50μ thickness. Further, a Cr film 0.2μ thick is formed by vacuum vapor deposition to produce an opaque electroconductive layer 26. Insulating layer 25 and opaque electroconductive layer 26 are not formed at a leading portion of each of common electrode layer 23 and individual electrode layer 24. The electrode width A of the electrodes of individual electrode layer 24 is, for example, 95μ and the electrode length B is, for example, 5000μ, and the space C between adjacent electrodes is, for example, 30μ.

In the photosensor array according to this embodiment, light from the opposite side of glass substrate 21, that is, light from the side opposite to that from which image information signal light comes, is excluded by an opaque electroconductive layer 26, resulting in no noise and improved resolution. Since opaque electrconductive layer 26 is electroconductive, when the layer 26 is earthed, electrical noise generated at the driving portion and other noise are prevented from flowing into common electrode layer 23 and individual electrode layer 24, and thereby, the resolution is improved.

In the photosensor array of this embodiment, the insulating layer 25 is sandwiched between the opaque electroconductive layer 26 and the common electrode layer 23 and individual electrode layer 24, and therefore, electric capacitance is formed between the electrode layers 23 and 24 and the electroconductive layer 26. However, since the specific dielectric constant of polyimide resin is as low as about 3 and the film thickness is as thick as 50μ, the capacitance generated for one individual electrode layer is about 1 pF or less, which hardly affects the reading electric signal.

Furthermore, in the embodiment of the photosensor array, insulating layer 25 and opaque electroconductive layer 26 function as a passivation film. That is, for comparison, a photosensor array was produced following the procedure mentioned above except that insulating layer 25 and opaque electroconductive layer 26 were not formed. The resulting photosensor array and the above-mentioned photosensor array according to the present invention were subjected to a reliability test at high temperature and humidity (temperature, 85° C.; humidity, 85%; 5000 hours) and a temperature cycle test ($-50°$ C.$\leftarrow$-$150°$ C., 20 minutes at each temperature, 100 cycles). The result of these tests was that deterioration of the photosensor array according to the present invention was negligibly small compared with that of the photosensor array of the comparison example.

Figure 3:
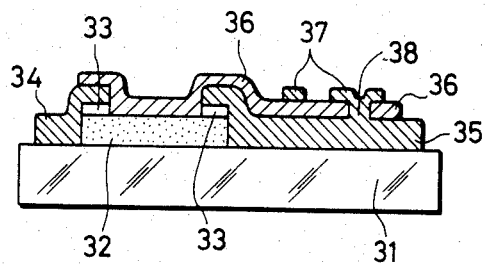
FIG. 3 is a cross sectional view of a photosensor array according to the present invention.

FIG. 3 is a schematic cross section of a photosensor array of the second embodiment of the present invention. In FIG. 3, 31 is a substrate 32 a photoconductive layer constituting a photoelectric transducer portion, 33 an ohmic contact layer, 34 and 35 are photosensor electrodes, 36 is an insulating layer ahd 37 an external electrode, specifically a driving circuit electrode.

The above-mentioned photosensor array may be fabricated by applying a CVD (chemical vapor deposition) method to form a photoconductive layer 32 composed of amorphous silicon on the surface of a substrate 31 composed of a glass plate #7059 (tradename, supplied by Corning Co.,), forming an $n^+$ layer composed of amorphous silicon on the layer 32 according to a CVD method, forming an Al electroconductive layer thereon using vacuum sputtering, forming photosensor electrodes 34 and 35 of predetermined shapes using a photolithography technique, applying dry etching to remove the exposed portion of the above-mentioned $n^+$ layer to produce ohmic contact layer 33, applying a polyimide resin thereto by spinner coating and thermally treating the applied resin to produce continuously a protective insulating layer for the photoconductive layer and an insulating layer at a multilayer wiring portion, forming a throughhole 38 using a lithographic technique, producing on Al electroconductive layer by vacuum sputtering, and finally forming a driving circuit electrode 37 of a predetermined shape by means of photolithography.

In the above-mentioned embodiment, the protective and insulating layer for the photoconductive layer and the insulating layer at the multilayer wiring portion are constituted of a polyimide resin, but as an insulating layer, a $SiO_2$ layer may be used. The $SiO_2$ layer may be produced by applying, for example, an organic silicon by means of dipping or spinner coating, and then thermally treating the resulting layer, or, further, applying $SiO_2$ by vacuum vapor deposition.

Figure 4A:
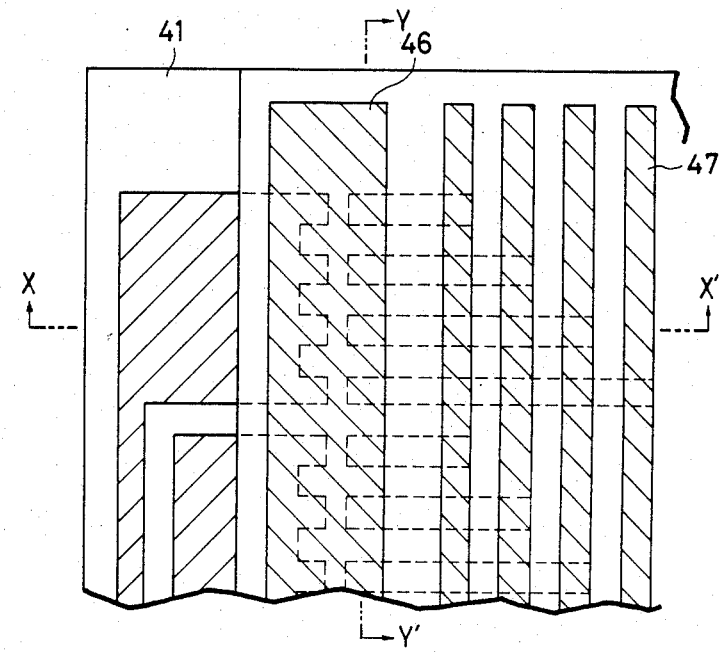
FIG. 4A is a partial plan view of a photosensor array according to the present invention.
Figure 4B:
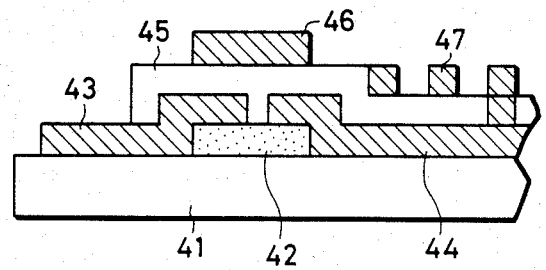
FIG. 4B and FIG. 4C are the X—X' cross section and the Y—Y' cross section of FIG. 4A, respectively.
Figure 4C:
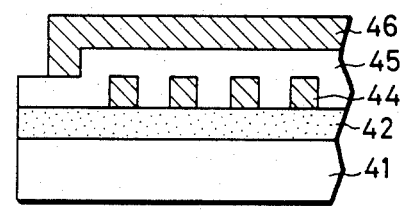

FIGS. 4A, 4B and 4C show a third embodiment of the photosensor array according to the present invention. FIG. 4A is a schematic partial plan view, FIG. 4B is the X—X' schematic cross section, and FIG. 4C is the Y—Y' schematic cross section. In FIG. 4, 41 is a substrate, 42 a photoconductive layer, 43 a common electrode layer, 44 an individual electrode layer, 45 an insulating layer and 46 an opaque electroconductive layer. These are similar to those in the first embodiment except that in the present embodiment the opaque electroconductive layer 46 is formed only above the photoconductive layer 42 as a photoelectric transducer portion to cover said photoconductive layer. On the other hand, upper electrode layers 47 are formed on the insulating layer 45 at the individual electrode layer 44 side. Upper electrode layers 47 are arranged at equal spaces such that the direction of the layers 47 is substantially perpendicular to the direction of individual electrode layers 44. Upper electrode layers or external electrodes 47 are connected with appropriate individual electrodes of the first electrode layer 44 at predetermined sites and the individual electrode layers 44 are connected with an external power source through the upper electrode layers 47.

In the photosensor array of the present embodiment, opaque electroconductive layer 46 has light shielding and electric shielding functions.

Figure 5:
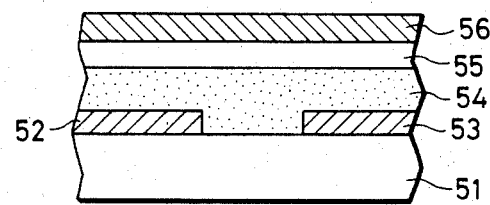
FIG. 5 is a partial cross section of a photosensor array according to the present invention.

FIG. 5 shows a schematic partial cross section of a fourth embodiment of photosensor array aaccording to the present invention. In this embodiment, a common electrode layer 52 and an individual electrode layer 53 are provided on a substrate 51 and then a photoconductive layer 54 is formed thereon. 55 is an insulating layer and 56 an opaque electroconductive layer.

In view of the foregoing, according to the present invention, an opaque electroconductive layer is formed above a photoconductive layer and electrodes and at the side opposite to the side which is irradiated with a signal light, and an insulating layer intervenes between the opaque electroconductive layer and the photoconductive layer and electrode layers. Thus a light coming from the side opposite to the signal light side with respect to the substrate can be blocked to prevent undesirable effects of noise caused by light other than the signal light and further it is possible to prevent electric noises generated at external portions such as driving portions and the like from flowing into the electrode layers since the opaque electroconductive layer is electroconductive, and as a result, the resolution can be improved to a great extent.

The fabrication steps can be simplified and the fabrication cost can be reduced by continuously forming the protective and insulating layer for the photoconductive layer at the photoelectric transducer portion of the photosensor array and the insulating layer between electrodes at the multilayer wiring portion by using the same material.

In addition, the protective and insulating layer for the photoconductive layer at the photoelectric transducer portion and the insulating layer between electrodes at the multilayer wiring portion may be continuously formed with the same material, and an opaque electroconductive layer is formed on the insulating layer. As a result, the fabrication steps are simplified, and any influences caused by noises due to lights other than signal light and by electric noises generated externally and affecting the photoelectric transducer portion and the multilayer wiring portion can be prevented, and the resolution is improved.

As is clear from above, according to the present invention, there are provided photosensor arrays of low cost and excellent performance

What we claim is:

1. A photosensor array comprising a substrate, a photoconductive layer and first and second electrode layers between which the photoconductive layer is provided, the array having a first side on which a signal light is to be projected for operation of the array and a second side opposite to the first side, an opaque electrconductive layer provided at the second side of the array, and an insulating layer intervening between the opaque electroconductive layer and the combination of the electrode layers and the photoconductive layer.

2. A photosensor array according to claim 1 further comprising an external electrode provided above the first electrode layer, the insulating layer intervening between the external electrode and the first electrode layer, wherein the first electrode layer comprises a plurality of electrode and the external electrode is connected to predetermined ones of the electrodes of the first electrode layer at respective sites.

3. A photosensor array according to claim 1 in which the photoconductive layer comprises amorphous silicon.

4. A photosensor array according to claim 1 in which the opaque electroconductive layer material is selected from chromium, titanium, aluminum, tantalum and carbon paste.

5. A photosensor array comprising a photoelectric transducer portion, electrodes contacting the electric transducer portion, a multilayer wiring contacting predetermined ones of the electrodes for matrix-driving the array, a first insulating layer, disposed between the predetermined electrodes contacted by the multilayer wiring portion, and a second, protective insulating layer, disposed at the photoelectric transducer portion, wherein the first and second insulating layers are continuously formed by using the same material.

6. A photosensor array according to claim 5 in which the insulating layer comprises polyimide resin.

7. A photosensor array according to claim 5 in which the insulating layer comprises $SiO_2$.

8. A photosensor array according to claim 5 in which an opaque electrconductive layer is formed on the first and second insulating layers.

* * * * *